(12) United States Patent
Akita

(10) Patent No.: US 12,106,881 B2
(45) Date of Patent: Oct. 1, 2024

(54) NOISE FILTER

(71) Applicant: KABUSHIKI KAISHA TOYOTA JIDOSHOKKI, Kariya (JP)

(72) Inventor: Yoshifumi Akita, Aichi-ken (JP)

(73) Assignee: KABUSHIKI KAISHA TOYOTA JIDOSHOKKI, Kariya (JP)

( * ) Notice: Subject to any disclaimer, the term of this patent is extended or adjusted under 35 U.S.C. 154(b) by 7 days.

(21) Appl. No.: 18/028,630

(22) PCT Filed: Sep. 21, 2021

(86) PCT No.: PCT/JP2021/034630
§ 371 (c)(1),
(2) Date: Mar. 27, 2023

(87) PCT Pub. No.: WO2022/071031
PCT Pub. Date: Apr. 7, 2022

(65) Prior Publication Data
US 2023/0335326 A1  Oct. 19, 2023

(30) Foreign Application Priority Data
Sep. 29, 2020 (JP) .................. 2020-162967

(51) Int. Cl.
*H01F 27/00* (2006.01)
*H01F 17/00* (2006.01)
*H02M 1/44* (2007.01)
*H03H 7/09* (2006.01)

(52) U.S. Cl.
CPC ............ *H01F 27/006* (2013.01); *H02M 1/44* (2013.01); *H03H 7/09* (2013.01); *H01F 2017/0093* (2013.01)

(58) Field of Classification Search
CPC ............... H01F 27/006; H01F 27/2895; H01F 2017/0093; H02M 1/44; H03H 7/09
See application file for complete search history.

(56) References Cited

U.S. PATENT DOCUMENTS

2020/0298654 A1* 9/2020 Kagawa ............. B60H 1/00642
2021/0327629 A1* 10/2021 Sugawara ............. H01F 27/306

FOREIGN PATENT DOCUMENTS

JP   2017-188681 A   10/2017

* cited by examiner

*Primary Examiner* — Jeffrey M Shin
(74) *Attorney, Agent, or Firm* — Sughrue Mion, PLLC

(57) ABSTRACT

A noise filter includes a capacitor and a common mode choke coil. The noise filter is connected between a first power conversion device configured to perform a switching operation at a first frequency and a second power conversion device configured to perform a switching operation at a second frequency higher than the first frequency. The common mode choke coil includes a core, and a first winding wire and a second winding wire wound around the core. The common mode choke coil has an inductance which is set such that a resonant frequency of the noise filter when the core is magnetically saturated is higher than the first frequency and lower than the second frequency.

3 Claims, 2 Drawing Sheets

NOISE FILTER

CROSS-REFERENCE TO RELATED APPLICATIONS

This application is a National Stage of International Application No. PCT/JP2021/034630 filed Sep. 21, 2021, claiming priority based on Japanese Patent Application No. 2020-162967 filed Sep. 29, 2020, the contents of all of which are incorporated herein by reference in their entirety.

TECHNICAL FIELD

The present disclosure relates to a noise filter.

BACKGROUND ART

There is known a noise filter disclosed in Patent Document 1. The noise filter disclosed in the Patent Document 1 is connected between a first power conversion device and a second power conversion device. The noise filter includes a capacitor and a common mode choke coil. The common mode choke coil includes a core, a first winding wire, and a second winding wire. The common mode choke coil has a leakage inductance. The noise filter reduces conducting noise. The conducting noise includes normal mode noise and common mode noise. Although the common mode choke coil is mainly used for reducing the common mode noise, since the common mode choke coil has a normal mode inductance as the leakage inductance, the common mode choke coil also has an advantageous effect in reducing the normal mode noise.

CITATION LIST

Patent Document

Patent Document 1: Japanese Patent Application Publication No. 2017-188681

SUMMARY OF INVENTION

Technical Problem

Magnetic saturation may occur in the core. In a state in which the core is magnetically saturated, magnetic permeability of the core decreases. With this phenomenon, the normal mode inductance of the common mode choke coil decreases. A resonant frequency of the noise filter increases as the normal mode inductance of the common mode choke coil decreases. When a frequency of the normal mode noise transmitted to the noise filter coincides with a resonant frequency of the noise filter, resonance occurs in the noise filter. In this case, there is a problem in which the resonant noise is transmitted to devices connected to the noise filter. The normal mode coil may be separately provided to prevent the resonance in the noise filter. However, the normal mode coil provided separately increases a size of the noise filter, which is a problem.

It is an objective of the present disclosure to provide a noise filter capable of achieving a reduction in size.

Solution to Problem

The noise filter to solve the above-described problem includes a capacitor and a common mode choke coil. The noise filter is connected between a first power conversion device configured to perform a switching operation at a first frequency and a second power conversion device configured to perform a switching operation at a second frequency higher than the first frequency. The common mode choke coil includes a core and a first winding wire and a second winding wire wound around the core. The common mode choke coil has an inductance which is set such that a resonant frequency of the noise filter when the core is magnetically saturated is higher than the first frequency and lower than the second frequency.

With this configuration, even when the common mode choke coil is magnetically saturated, the resonant frequency of the noise filter is higher than the first frequency and lower than the second frequency. Thus, this configuration prevents the resonant frequency of the noise filter from coinciding with the first frequency and the second frequency without separately providing the normal mode coil in the noise filter. Accordingly, a reduction in size of the noise filter is achieved.

In the above-described noise filter, the first winding wire and the second winding wire are preferably an edgewise winding wire.

In the above-described noise filter, preferably, the first power conversion device is a DC/AC inverter, the second power conversion device is a DC/DC converter, and the noise filter is connected between input terminals of the DC/DC converter and charging terminals connected to an external power supply.

Advantageous Effect of Invention

According to the present disclosure, the reduction in size of the noise filter is achieved.

DESCRIPTION OF EMBODIMENTS

The following will describe an embodiment of a noise filter with reference to FIGS. 1 to 5. The noise filter of the present embodiment is used in vehicles such as an electric vehicle and a hybrid vehicle.

Figure 1:
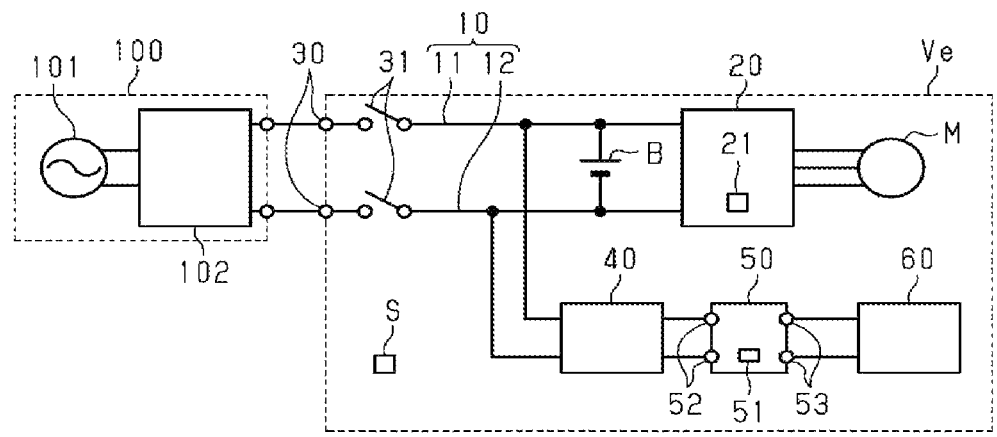
FIG. 1 is a circuit diagram schematically illustrating an entire circuit of a system using a noise filter according to a present embodiment.

As illustrated in FIG. 1, a vehicle Ve includes a starting switch S, a power line 10, a battery B, a DC/AC inverter 20 as a first power conversion device, a traveling motor M, charging terminals 30, charging switches 31, a noise filter 40, a DC/DC converter 50 as a second power conversion device, and a load 60. The vehicle Ve is, for example, an electric vehicle or a hybrid vehicle which travels by the traveling motor M.

The starting switch S switches between an activated state and a stopped state of the vehicle Ve. The starting switch S may be operated by a driver of the vehicle Ve. The activated state allows the vehicle Ve to travel. The stopped state does not allow the vehicle Ve to travel. The starting switch S is also called an ignition switch, a system activation switch, or the like. The activated state and the stopped state are also called an ignition-on and an ignition-off, respectively.

A power is supplied to an electrical system of the vehicle Ve through the power line 10. The power line 10 includes a high-level voltage line 11 and a low-level voltage line 12.

The battery B is, for example, a battery having a nominal voltage of 200 [V]. The battery B is used as an electric power source that supplies a power to vehicle-mounted electric devices, such as the traveling motor M and the load 60. An example of the battery B is a battery in which a plurality of chargeable and dischargeable power storage devices such as a lithium-ion storage battery are connected to each other.

A positive terminal of the battery B is connected to the high-level voltage line 11.

A negative terminal of the battery B is connected to the low-level voltage line 12.

The DC/AC inverter 20 is connected to the power line 10. A DC voltage across the battery B is input into the DC/AC inverter 20 through the power line 10. The DC/AC inverter 20 includes a switching element 21. When the vehicle Ve is in the activated state, the DC/AC inverter 20 converts the DC power supplied from the battery B into an AC power by a switching operation of the switching element 21 in the DC/AC inverter 20, and outputs the AC power. For example, the DC/AC inverter 20 performs power conversion by a pulse width modulation (PWM). Examples of the pulse width modulation include a triangular wave comparison method in which a triangular wave serves as a carrier wave. The switching element 21 in the DC/AC inverter 20 performs the switching operation at a first frequency f1. The first frequency f1 in the present embodiment refers to a switching frequency of the switching element 21 in the DC/AC inverter 20. The first frequency f1 is, for example, 10 [kHz]. The DC/AC inverter 20 generates conducting noise mainly composed of a frequency component at the first frequency f1 by the switching operation of the switching element 21. The conducting noise generated from the DC/AC inverter 20 is transmitted to the power line 10.

The traveling motor M is a motive power source that drives wheels of the vehicle Ve. The traveling motor M is driven by a power output from the DC/AC inverter 20. In one example, a three-phase alternating motor is used as the traveling motor M.

The charging terminals 30 are terminals through which a power is supplied from an external power supply 100 to the vehicle Ve. The charging terminals 30 are connected to the external power supply 100. Any power supply system may be used as the external power supply 100 as long as the external power supply 100 outputs a DC voltage. For example, the external power supply 100 includes a commercial power supply 101 and a charging AC/DC converter 102. The commercial power supply 101 is a system power supply that supplies an AC power into a plurality of pieces of demand equipment of a customer through a distribution board. In the present embodiment, the AC power from the commercial power supply 101 is supplied to the charging AC/DC converter 102. That is, the charging AC/DC converter 102 refers to one of the pieces of demand equipment of the customer.

The charging AC/DC converter 102 converts the input AC voltage to a DC voltage, and outputs the DC voltage. The DC voltage output from the charging AC/DC converter 102 is supplied to the battery B through the charging terminals 30. That is, the external power supply 100 serves as a charger that charges the battery B. When the vehicle Ve is connected to the external power supply 100, the vehicle Ve is set in the stopped state. Hereinafter, a state in which the external power supply 100 charges the battery B will be called a charging state.

The charging switches 31 switch a state of connection between the charging terminals 30 and the power line 10. The charging switches 31 are connected to the power line 10. Each of the charging switches 31 is connected between the corresponding charging terminal 30 and the power line 10. When the charging switches 31 are ON, the charging terminals 30 and the power line 10 are electrically connected to each other. When the charging switches 31 are OFF, the charging terminals 30 and the power line 10 are electrically disconnected from each other. When the charging switches 31 turn ON, the external power supply 100 supplies the power to the vehicle Ve. The charging switches 31 are, for example, a relay switch. Any suitable switch such as a MOSFET or an IGBT may be used as the charging switches 31.

The noise filter 40 is a filter circuit through which conducting noise is reduced. The noise filter 40 is connected to the power line 10. A detail of the noise filter 40 will be described later.

The DC/DC converter 50 includes a switching element 51, input terminals 52, and output terminals 53. The switching element 51 in the DC/DC converter 50 performs a switching operation at a second frequency f2. That is, the second frequency f2 in the present embodiment refers to a switching frequency of the switching element 51. The second frequency f2 is, for example, 170 [kHz], which is higher than the first frequency f1.

The input terminals 52 of the DC/DC converter 50 are connected to the power line 10 through the noise filter 40. The DC/AC inverter 20 is connected to the power line 10. Accordingly, the noise filter 40 is connected between the DC/AC inverter 20 and the DC/DC converter 50. In addition, the power line 10 has the charging terminals 30. Thus, the noise filter 40 is connected between the input terminals 52 of the DC/DC converter 50 and the charging terminals 30 provided in the external power supply 100.

The DC/DC converter 50 drops a voltage input to the input terminals 52 of the DC/DC converter 50 by the switching operation of the switching element 51 of the DC/DC converter 50, and outputs the dropped voltage. The output voltage across the output terminals 53 of the DC/DC converter 50 is, for example, 12 [V]. The DC/DC converter 50 generates conducting noise mainly composed of a frequency component at the second frequency f2 by the switching operation of the switching element 51 and outputs the conducting noise from the input terminals 52 of the DC/DC converter 50

The load 60 is electrical equipment mounted on the vehicle Ve. Examples of the load 60 include a light and an audio device. The load 60 is driven by the DC voltage output from the output terminals 53 of the DC/DC converter 50. A drive voltage of the load 60 is, for example, 12 [V].

The following will describe the detail of the noise filter 40.

Figure 2:
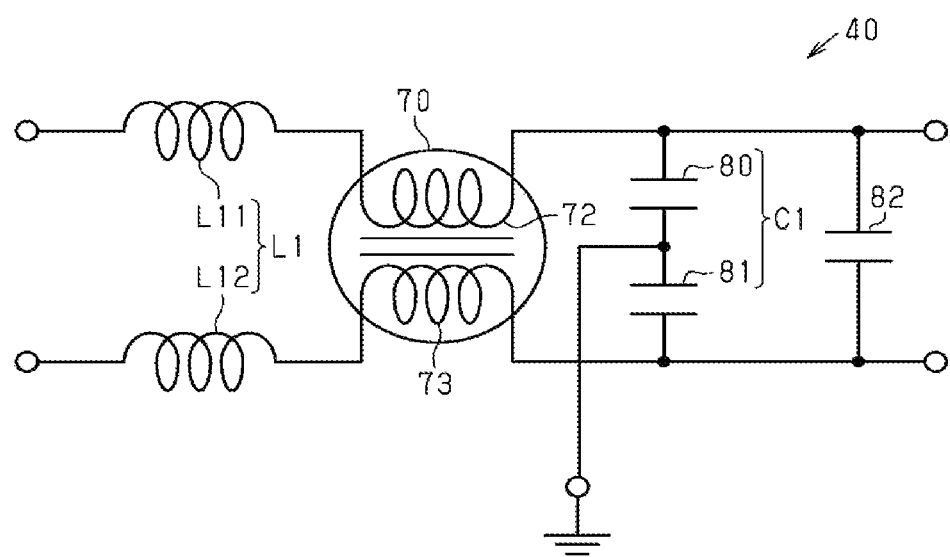
FIG. 2 is a circuit diagram of the noise filter according to the present embodiment.

As illustrated in FIG. 2, the noise filter 40 includes a common mode choke coil 70, a first bypass capacitor 80, a second bypass capacitor 81, and a capacitor 82.

Figure 3:
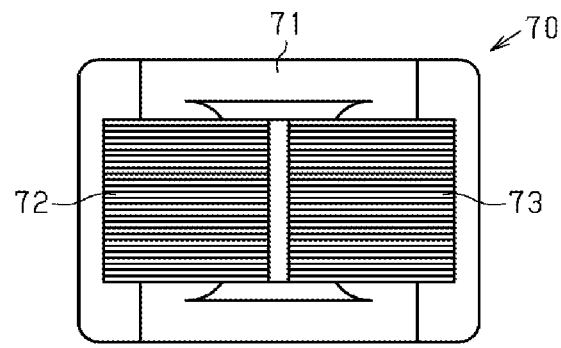
FIG. 3 is a front view of a common mode choke coil.
Figure 4:
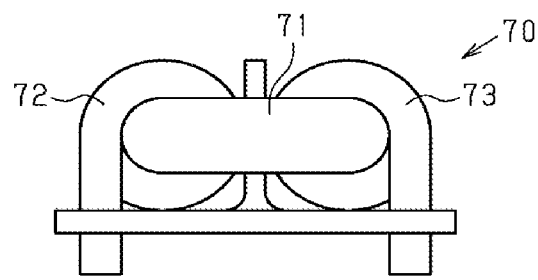
FIG. 4 is a side view of the common mode choke coil.

As illustrated in FIGS. 2 to 4, the common mode choke coil 70 includes a core 71, a first winding wire 72, and a second winding wire 73.

The core 71 is, for example, a ferrite core and made from a ferromagnet. In the present embodiment, the core 71 is formed in a ring-shape. The word of "ring-shape" used in the description may refer to any suitable structure in which a loop is formed or a general loop-shaped structure such as a continuous shape which has no ends or a C-shape which has a gap. The shape of "ring-shape" includes a circle-shape, an ellipse-shape, and a polygonal shape having an sharp corner or a rounded corner, and is not limited to these shapes.

The first winding wire 72 is wound around the core 71. A first end of the first winding wire 72 is connected to the high-level voltage line 11.

The second winding wire 73 is wound around the core 71. A first end of the second winding wire 73 is connected to the low-level voltage line 12.

The first winding wire 72 and the second winding wire 73 are wound around the core 71 in such a manner that when common mode currents, which are currents having the same direction, flow through the first winding wire 72 and the second winding wire 73, magnetic flux through the first winding wire 72 and magnetic flux through the second winding wire 73 are generated and strengthen each other whereas when normal mode currents, which are currents oppositely directed, flow through the first winding wire 72 and the second winding wire 73, magnetic flux through the first winding wire 72 and magnetic flux through the second winding wire 73 are generated and cancel each other.

The common mode choke coil 70 generates leakage magnetic flux when the normal mode currents flow through the first winding wire 72 and the second winding wire 73. For this reason, the common mode choke coil 70 when the core 71 is not magnetically saturated is considered to have an imaginary normal mode coil L1 having a normal mode inductance La as a leakage inductance. The imaginary normal mode coil L1 includes a first imaginary normal mode coil L11 having a normal mode inductance as a leakage inductance of the first winding wire 72 and a second imaginary normal mode coil L12 having a normal mode inductance as a leakage inductance of the second winding wire 73. The first imaginary normal mode coil L11 is connected to the first end of the first winding wire 72 in series. The second imaginary normal mode coil L12 is connected to the first end of the second winding wire 73 in series.

As illustrated in FIG. 2, the first bypass capacitor 80 and the second bypass capacitor 81 are connected to each other in series. A node between the first bypass capacitor 80 and the second bypass capacitor 81 is grounded. The first bypass capacitor 80 and the second bypass capacitor 81 constitute a series combination C1. A first end of the series combination C1 is connected to a second end of the first winding wire 72. A second end of the series combination C1 is connected to a second end of the second winding wire 73.

A first end of the capacitor 82 is connected to the second end of the first winding wire 72. A second end of the capacitor 82 is connected to the second end of the second winding wire 73. That is, the capacitor 82 is connected to the series combination C1 in parallel.

The noise filter 40 in the present embodiment includes the common mode choke coil 70, the series combination C1, and the capacitor 82, which are connected in this order from the power line 10 toward the input terminals 52 of the DC/DC converter 50.

The noise filter 40 serves as a low pass filter for the common mode currents by the common mode choke coil 70 and the series combination C1. In addition, the noise filter 40 also serves as a low pass filter for the normal mode currents by the imaginary normal mode coil L1 and the capacitor 82. That is, the noise filter 40 reduces both the common mode noise and the normal mode noise.

In the charging state, the external power supply 100 supplies a power to the input terminals 52 of the DC/DC converter 50 through the charging terminals 30. The power supplied to the input terminals 52 of the DC/DC converter 50 is output from the output terminals 53 to the load 60. Thus, in the charging state, the conducting noise generated from the DC/DC converter 50 and output from the input terminals 52 of the DC/DC converter 50 is transmitted to the power line 10 through the noise filter 40. The conducting noise transmitted to the power line 10 is transmitted to the external power supply 100 through the charging terminals 30. The conducting noise transmitted to the external power supply 100 may be transmitted to the other demand equipment through the distribution board. In this case, an intensity of the conducting noise transmitted from the vehicle Ve to the external power supply 100 needs to be lower than a reference value specified by a specified regulation, for example, ECE Regulation 10, or the like.

Here, a current flowing through the common mode choke coil 70 has a DC current component supplied from the battery B or the external power supply 100 and an AC current component generated from the DC/DC converter 50. The AC current component includes the conducting noise generated from the DC/DC converter 50. The DC current component excites the core 71. Hereinafter, the DC current component will be called a superimposed DC current Idc.

Figure 5:
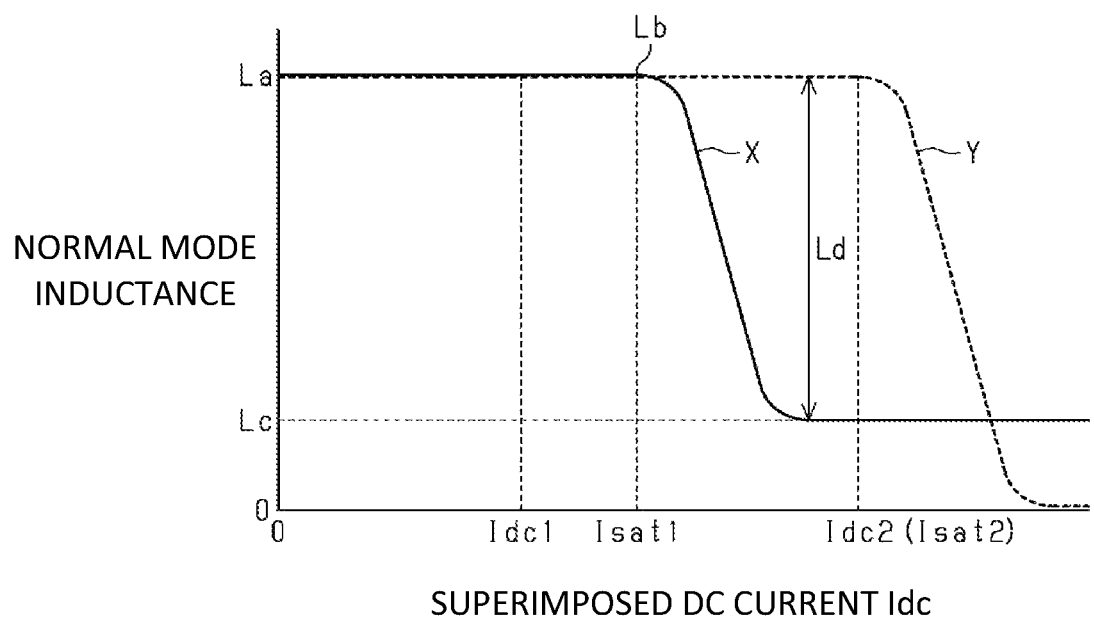
FIG. 5 is a graph showing superimposed DC current characteristics of the common mode choke coils.

FIG. 5 illustrates a superimposed DC current characteristic X of the common mode choke coil 70 in the present embodiment. It is noted that the superimposed DC current characteristic in the present embodiment refers to a relation between the superimposed DC current Idc flowing through the common mode choke coil and the normal mode inductance of the common mode choke coil.

As illustrated in FIGS. 2 to 5, in response to a certain amount of the superimposed DC current Idc or more flowing through the common mode choke coil 70, magnetic saturation occurs in the core 71. This phenomenon releases magnetic coupling between the first winding wire 72 and the second winding wire 73 with the core 71 disposed therebetween. In addition, magnetic permeability of the core 71 decreases to almost the same magnitude as that of an air-core coil. Hereinafter, a value of the superimposed DC current Idc in which the normal mode inductance of the common mode choke coil 70 starts to decrease will be called a magnetic saturation allowable current Isat1. In addition, the normal mode inductance of the common mode choke coil 70 when the superimposed DC current Idc is the magnetic saturation allowable current Isat1 will be called a critical inductance Lb.

When the superimposed DC current Idc is over the magnetic saturation allowable current Isat1, the normal mode inductance decreases from the critical inductance Lb, and converges to a constant residual inductance Lc. Hereinafter, an inductance between the critical inductance Lb and the residual inductance Lc will be called an inductance Ld. As the normal mode inductance decreases, a noise removal performance of the noise filter 40 decreases.

The load 60 is driven when the vehicle Ve is either in a traveling state or the charging state. For this reason, when the vehicle Ve is either in the traveling state or the charging state, the battery B or the external power supply 100 needs to supply a power to the DC/DC converter 50. The required power to drive the load 60 in the traveling state is larger than that in the charging state. Accordingly, a maximum current during charging Idc1 is smaller than a maximum current during traveling Idc2. The maximum current during charging Idc1 refers to a maximum value of the superimposed DC current Idc in the charging state. The maximum current during traveling Idc2 refers to a maximum value of the superimposed DC current Idc in the traveling state.

The noise filter 40 of the present embodiment reduces the conducting noise that is to be transmitted from the DC/DC converter 50 to the external power supply 100. In the present embodiment, when the vehicle Ve is in the charging state, the conducting noise may be transmitted to the external power supply 100. In other word, the noise removal performance of the noise filter 40 when the vehicle Ve is in the traveling state may be lower than that when the vehicle Ve is in the charging state.

For this reason, the core 71 in the present embodiment is designed such that the magnetic saturation allowable current Isat1 of the common mode choke coil 70 is larger than the maximum current during charging Idc1 and smaller than the maximum current during traveling Idc2.

On the other hand, the normal mode inductance of the common mode choke coil 70, when the core 71 is magnetically saturated, decreases from the critical inductance Lb, and converges to the constant residual inductance Lc.

When a resonant frequency f0 determined by the normal mode inductance of the common mode choke coil 70 and a capacitance of the capacitor 82 approaches the second frequency f2 with the decrease of the normal mode inductance, resonance may occur in the noise filter 40 by the conducting noise from the DC/DC converter 50.

For this reason, the inductance Ld of the common mode choke coil 70 is set such that the resonant frequency f0 is higher than the first frequency f1 and lower than the second frequency f2. Specifically, a type of the first winding wire 72 and a type of the second winding wire 73 are an edgewise winding wire, and the number of turns in an inductor of the first winding wire 72 and the number of turns in an inductor of the second winding wire 73 are set such that the resonant frequency f0 is higher than the first frequency f1 and lower than the second frequency f2.

The following will describe an operation of the present embodiment.

As shown by the superimposed DC current characteristic X of the common mode choke coil 70 of the present embodiment in FIG. 5, the maximum current during charging Idc1 of the common mode choke coil 70 in the present embodiment is smaller than the magnetic saturation allowable current Isat1. Accordingly, the core 71 is not magnetically saturated in the charging state. The maximum current during traveling Idc2 of the common mode choke coil 70 in the present embodiment is larger than the magnetic saturation allowable current Isat1. Accordingly, the core 71 may be magnetically saturated in the traveling state. When the core 71 is magnetically saturated, the normal mode inductance of the common mode choke coil 70 decreases from the critical inductance Lb and converges to the constant residual inductance Lc. Accordingly, the noise removal performance of the noise filter 40 decreases. However, even when the core 71 is magnetically saturated, the common mode choke coil 70 of the present embodiment is set such that the resonant frequency f0 of the noise filter 40 is higher than the first frequency f1 and lower than the second frequency f2. That is, this configuration prevents the resonant frequency f0 of the noise filter 40 from coinciding with the first frequency f1 and the second frequency f2. Since the conducting noise generated from the DC/DC converter 50 is mainly composed of the second frequency f2, even when the core 71 is magnetically saturated, the resonance in the noise filter 40 by the conducting noise generated from the DC/DC converter 50 is prevented.

On the other hand, as shown by a superimposed DC current characteristic Y of a common mode choke coil in a comparative example in FIG. 5, the magnetic saturation allowable current Isat2 of the comparative example has the same value as that of the maximum current during traveling Idc2. Accordingly, a core of the common mode choke coil in the comparative example is designed such that magnetic saturation does not occur in the core of the common mode choke coil in the comparative example in the charging state and the magnetic saturation is less likely to occur in the core of the common mode choke coil in the comparative example in the traveling state. However, a size of the core needs to be increased in order to increase the magnetic saturation allowable current while keeping the normal mode inductance to be constant.

The following will describe advantages according to the present embodiment.

(1) The common mode choke coil 70 has the inductance Ld which is set such that the resonant frequency f0 of the noise filter 40 when the core 71 is magnetically saturated is higher than the first frequency f1 and lower than the second frequency f2. This prevents resonance in the noise filter 40 by the conducting noise generated from the DC/DC converter 50 without separately providing the normal mode coil in the noise filter 40. Thus, a reduction in size of the noise filter 40 is achieved.

(2) The magnetic saturation allowable current Isat1 of the common mode choke coil 70 is larger than the maximum current during charging Idc1 and smaller than the maximum current during traveling Idc2. Accordingly, the noise removal performance of the noise filter 40 is maintained at least in the charging state. A size of the core 71 is decreased by setting the magnetic saturation allowable current Isat1 smaller than the magnetic current during traveling Idc2. Thus, the reduction in size of the noise filter 40 is achieved while the noise removal performance of the noise filter 40 is maintained in the charging state.

(3) An inductance per unit volume of the common mode choke coil 70 is increased by using the edgewise winding wire for the first winding wire 72. This further reduces the size of the noise filter 40.

(4) The noise filter 40 is connected between the input terminals 52 of the DC/DC converter 50 and the charging terminals 30. The conducting noise generated from the DC/DC converter 50 and output from the input terminals 52 in the charging state is reduced by the noise filter 40. When connecting the external power supply 100 to the vehicle Ve, the conducting noise generated from the vehicle Ve may be transmitted from the vehicle Ve to the external power supply 100 through the charging terminals 30. For this reason, the noise filter 40 needs to be provided to reduce the conducting noise that is to be transmitted. The vehicle Ve is connected to the external power supply 100 when the external power supply 100 charges the battery B, that is, in the charging state. The noise filter only needs to give the noise removal performance in the charging state. The maximum current during charging Idc1 is smaller than the maximum current during traveling Idc2. Regarding the common mode choke coil 70, it is necessary that the core 71 is not magnetically saturated by the superimposed DC current Idc in the charging state and the resonance in the noise filter 40 is prevented in the traveling state. Accordingly, the noise filter 40 connected between the input terminals 52 of the DC/DC converter 50 and the charging terminals 30 is formed as described in the present embodiment, thereby reducing the conducting noise that is to be transmitted from the vehicle Ve to the external power supply 100 while the size of the core 71 is reduced as compared to the case in which the core 71 is designed so as not to be magnetically saturated even in the traveling state. Thus, the reduction in size of the noise filter 40 is achieved.

The embodiment may be modified as described below. The embodiment and the following modifications may be combined with each other as long as they do not technically contradict each other.

The noise filter 40 does not need to be connected between the input terminals 52 of the DC/DC converter 50 and the charging terminals 30. For example, the noise filter 40 may be connected between the output terminals 53 of the DC/DC converter 50 and the load 60. This configuration reduces conducting noise that is to be transmitted from the DC/DC converter 50 to the load 60.

The first power conversion device is not limited to the DC/AC inverter 20, and may be any suitable device generating switching noise.

The second power conversion device is not limited to the DC/DC converter 50, and may be any suitable device generating switching noise at a frequency higher than a frequency of the switching noise generated from the first power conversion device.

The first winding wire 72 and the second winding wire 73 may have any suitable configuration as long as the first winding wire 72 and the second winding wire 73 have the inductance Ld that is set such that the resonant frequency f0 of the noise filter 40 when the core 71 is magnetically saturated is higher than the first frequency f1 and lower than the second frequency f2. For example, the first winding wire 72 and the second winding wire 73 do not need to be the edgewise winding wire, and may be various winding wires made of a round wire or a rectangular wire.

As long as the second winding wire 73 has the same frequency characteristic and DC current characteristic as those of the first winding wire 72, the number of turns of the second winding wire 73 does not need to be equal to the number of turns of the first winding wire 72. Similarly, the type of winding wire of the second winding wire 73 does not need to be the same as that of the first winding wire 72.

The shape of the core 71 is not limited to the ring-shape as long as the magnetic coupling between the first winding wire 72 and the second winding wire 73 is ensured. For example, the shape of the core 71 may be a bar-shape.

The core 71 does not need to be closed in the ring shape as long as the magnetic coupling between the first winding wire 72 and the second winding wire 73 is ensured. For example, the core 71 has therein a gap.

The charging switches 31 do not need to be provided in the vehicle Ve. For example, the charging switches 31 may be provided in the external power supply 100.

The charging terminals 30 do not need to be provided.

A circuit arrangement of the elements constituting the noise filter 40 is not limited to the circuit arrangement in the embodiment, and any suitable circuit arrangement may be used.

The series combination C1 does not need to be provided.

REFERENCE SIGNS LIST

20 DC/AC inverter
30 charging terminal
40 noise filter
50 DC/DC converter
52 input terminal
70 common mode choke coil
71 core
72 first winding wire
73 second winding wire
82 capacitor
f0 resonant frequency
f1 first frequency
f2 second frequency
Ld inductance

The invention claimed is:

1. A noise filter comprising:
a capacitor; and
a common mode choke coil,
the noise filter being connected between a first power conversion device configured to perform a switching operation at a first frequency and a second power conversion device configured to perform a switching operation at a second frequency higher than the first frequency, wherein
the common mode choke coil includes:
a core; and
a first winding wire and a second winding wire wound around the core, and
the common mode choke coil has an inductance which is set such that a resonant frequency of the noise filter when the core is magnetically saturated is higher than the first frequency and lower than the second frequency.

2. The noise filter according to claim 1, wherein
the first winding wire and the second winding wire are an edgewise winding wire.

3. The noise filter according to claim 1, wherein
the first power conversion device is a DC/AC inverter,
the second power conversion device is a DC/DC converter, and
the noise filter is connected between input terminals of the DC/DC converter and charging terminals connected to an external power supply.

* * * * *